United States Patent
Ceballos

(10) Patent No.: US 8,072,267 B2
(45) Date of Patent: Dec. 6, 2011

(54) PHASE MARGIN MODIFICATION IN OPERATIONAL TRANSCONDUCTANCE AMPLIFIERS

(75) Inventor: Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 96 days.

(21) Appl. No.: 12/481,088

(22) Filed: Jun. 9, 2009

(65) Prior Publication Data

US 2010/0308915 A1     Dec. 9, 2010

(51) Int. Cl.
*H03F 3/45* (2006.01)

(52) U.S. Cl. ......................................... 330/253; 330/292
(58) Field of Classification Search ................... 330/253, 330/255, 260, 292
See application file for complete search history.

(56) References Cited

U.S. PATENT DOCUMENTS 7,724,081 B2 *   5/2010   Botker ........................... 330/253

* cited by examiner

*Primary Examiner* — Khanh Nguyen
(74) *Attorney, Agent, or Firm* — Lee & Hayes, PLLC

(57) ABSTRACT

The present disclosure relates to phase margin modification in operational transconductance amplifiers.

20 Claims, 5 Drawing Sheets

PHASE MARGIN MODIFICATION IN OPERATIONAL TRANSCONDUCTANCE AMPLIFIERS

BACKGROUND

Folded cascode operational transconductance amplifiers (OTAs) tend to have a good power supply rejection ratio at high frequencies. To illustrate, folded cascode OTAs have the ability to reject a relatively large amount of noise from a power supply. Thus, folded cascode OTAs can be used in switched capacitor circuits associated with high-frequency applications.

Switched capacitor circuits including OTAs are typically associated with two non-overlapping clock phases, a charge transfer phase and a holding phase. During the charge transfer phase, charge accumulates in an integrating capacitor of a switched capacitor circuit, while during the holding phase, charge is stored in the integrating capacitor. An OTA of a switched capacitor circuit may have a particular phase margin during the charge transfer phase and the holding phase. The phase margin of the OTA provides a measure of stability of the OTA because the phase margin indicates a tendency of the OTA toward oscillation.

In some instances, biasing currents of an OTA included in a switched capacitor circuit are reduced in order to decrease power consumption. The decreased bias currents may result in performance issues related to slew rate and settling time.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

This disclosure includes techniques to modify the phase margin of an operational transconductance amplifier (OTA) used in a switched capacitor circuit in order to increase the speed at which charge is transferred to the integrating capacitor of the switched capacitor circuit during the charge transfer phase. Increasing the speed of the charge transfer phase in this way reduces the effects of a slow settling time without increasing power consumption. In some implementations, a non-dominant pole is added to the input of the OTA to reduce the phase margin. In other implementations, the phase margin is reduced by modifying an existing non-dominant pole of the OTA.

Figure 1:
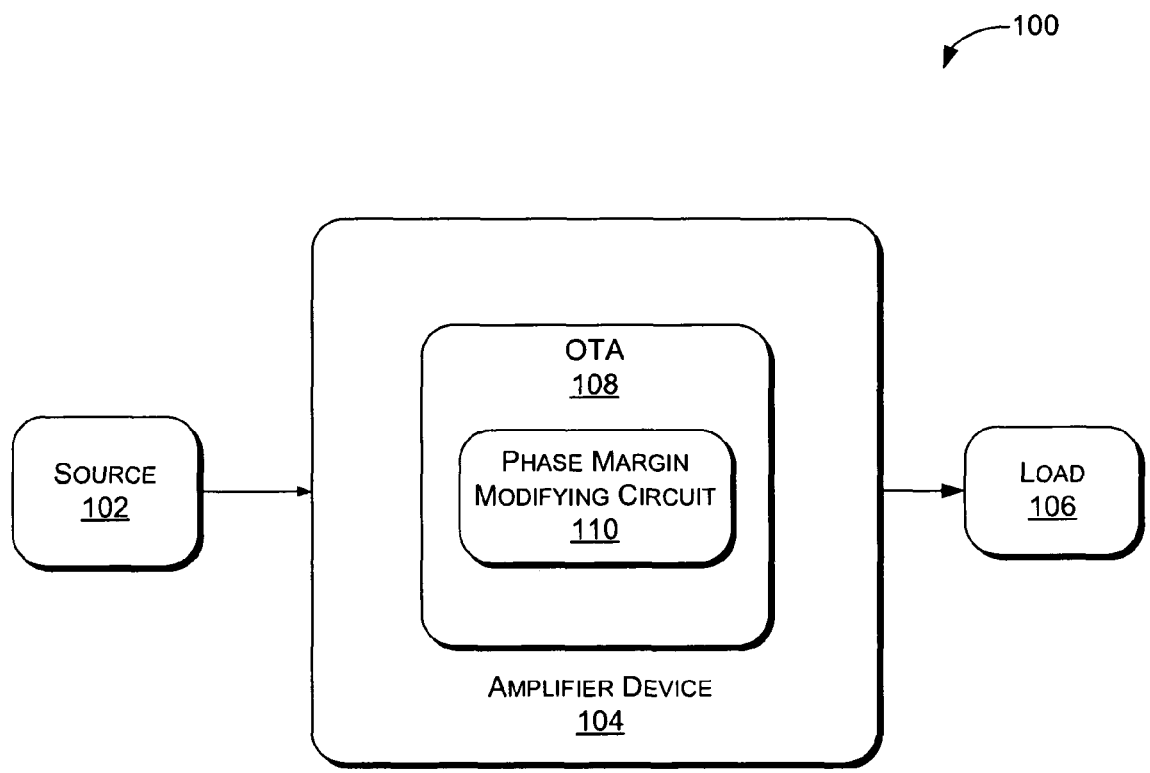
FIG. 1 is a schematic diagram of an amplifier circuit arrangement utilized to provide an amplified input signal from a source to a load.

FIG. 1 is a schematic diagram of a circuit arrangement 100 utilized to provide an amplified input signal from a source 102 to a load 106 via an amplifier device 104. In some instances, the circuit arrangement 100 may be a component of a wireless communication device such as a mobile phone, a portable computing device, a notebook computer, a personal digital assistant, a digital camera, or a combination of these or other devices.

The source 102 may include one or more circuits that provide one or more input signals to the amplifier device 104. The input signals may include radio frequency signals, audio signals, digital signals, or other signals, including signals carrying data.

The amplifier device 104 includes an operational transconductance amplifier (OTA) 108. In some implementations, the OTA 108 may be a folded cascode OTA. The OTA 108 includes a phase margin modifying circuit 110. The phase margin modifying circuit 110 may modify the phase margin of the OTA 108 during a charge transfer phase of the amplifier device 104.

Figure 2:
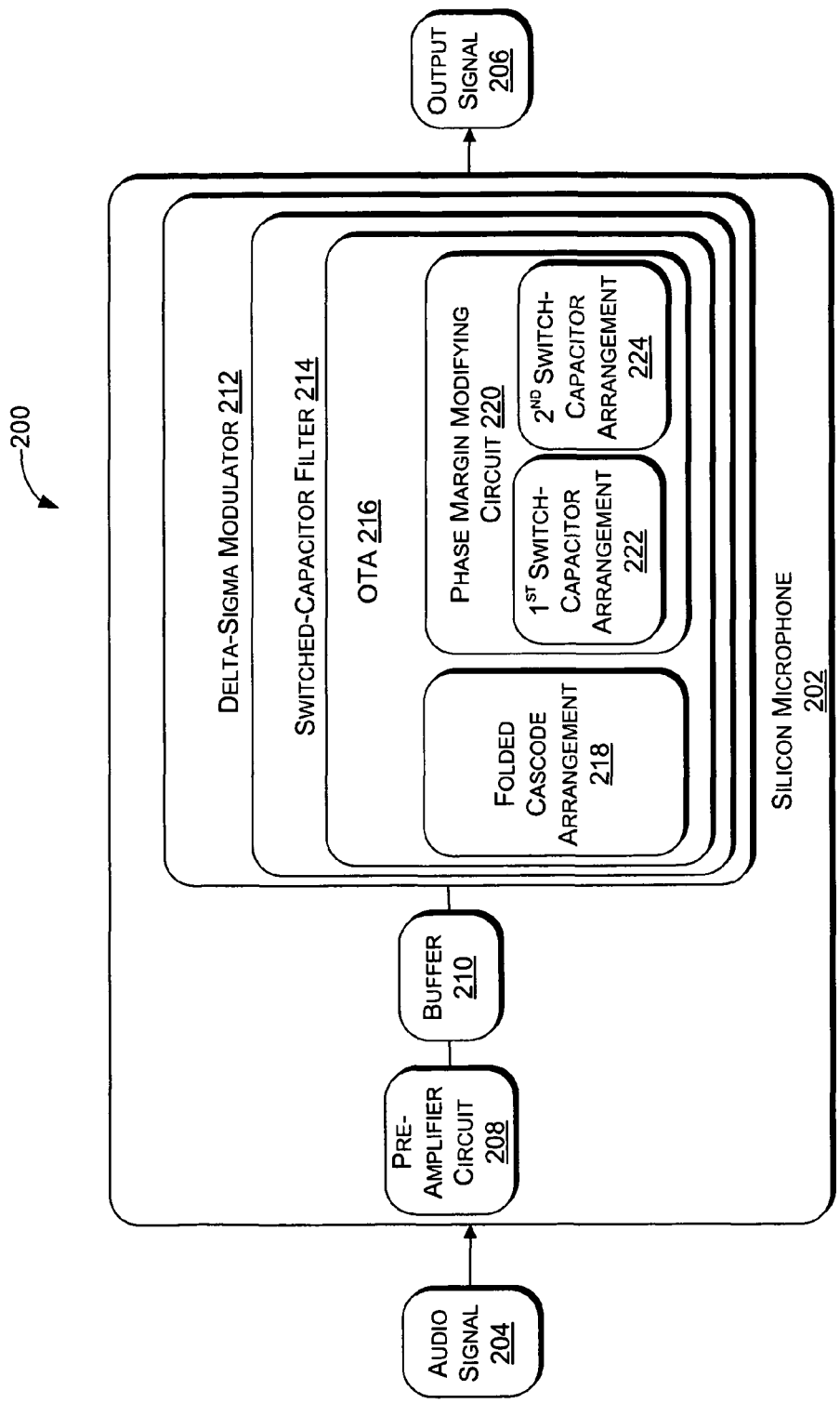
FIG. 2 is a schematic diagram of a system including a silicon microphone having a circuit to modify the phase margin of an operational transconductance amplifier.

FIG. 2 is a schematic diagram of a system 200 including a silicon microphone 202 having a circuit to modify the phase margin of an operational transconductance amplifier. The silicon microphone 202 can be used in automotive, industrial, and medical applications. In an illustrative implementation, the silicon microphone 202 receives an input audio signal 204 and produces an output signal 206. In some implementations, the output signal 206 may be a digital signal.

The silicon microphone 202 includes a pre-amplifier circuit 208 that receives the input audio signal 204 and provides a modified form of the input audio signal 204 to the delta-sigma modulator 212 via a buffer 210. The delta-sigma modulator 212 may convert the input audio signal 204 from an analog signal to a digital signal. The delta-sigma modulator 212 includes a switched capacitor filter 214 and the switched capacitor filter 214 includes an operational transconductance amplifier (OTA) 216. The OTA 216 includes a folded cascode arrangement 218 and a phase margin modifying circuit 220.

The phase margin modifying circuit 220 is configured to modify the phase margin of the OTA 216. The phase margin modifying circuit 220 includes a first switch-capacitor arrangement 222 and a second switch-capacitor arrangement 224. The first switch-capacitor arrangement 222 and the second switch-capacitor arrangement 224 may be coupled to an input portion of the folded cascode arrangement 218. In a particular implementation, the phase margin modifying circuit 220 modifies the phase margin of the OTA 216 during a charge transfer phase of the switched capacitor filter 214 by adding a non-dominant pole to the OTA 216. For example, during the charge transfer phase of the switched capacitor filter 214, one or more of the switches of the first switch-capacitor arrangement 222 and/or the second switch-capacitor arrangement 224 may be activated (e.g. opened or closed). By activating one or more switches of the first switch-capacitor arrangement 222 and/or the second switch-capacitor arrangement 224, current flow in the OTA 216 is altered to create an additional non-dominant pole of the OTA 216. Thus, the phase margin of the OTA 216 during the charge transfer phase is modified. In addition, during the holding phase of the switched capacitor filter 214, the one or more of the switches of the first switch-capacitor arrangement 222 and the second switch-capacitor arrangement 224 are operated in the opposite manner as during the charge transfer phase (i.e. switches opened during the charge transfer phase are closed during the holding phase and switches closed during the charge transfer phase are opened during the holding phase) and the OTA 216 operates without any influence from the additional non-dominant pole. Consequently, the phase margin of the OTA 216 returns to the initial phase margin. By adding a non-dominant pole to the OTA 216, the phase margin modifying circuit 220 may decrease the phase margin of the OTA 216 in order to increase the rate at which charge is transferred to an integrating capacitor of the switched capacitor filter 214 during the charge transfer phase, such that the switched capacitor filter 214 settles faster without increasing power consumption.

In another particular implementation, the phase margin modifying circuit 220 may modify a non-dominant pole of the OTA 216 in order to change the phase margin of the OTA 216. For example, during the charge transfer phase of the switched capacitor filter 214, one or more switches of the first switch-capacitor arrangement 222 and/or the second switch-capacitor arrangement 224 are operated to alter current flow through the OTA 216. The one or more switches of the first switch-capacitor arrangement 222 and/or the second switch-capacitor arrangement 224 are operated in a manner that modifies a non-dominant pole of the OTA 216 to decrease the phase margin of the OTA 216. During the holding phase of the switched-capacitor filter 214, the one or more switches of the first switch-capacitor arrangement 222 and/or the second switch-capacitor arrangement 224 are operated in the opposite manner as during the charge transfer phase to facilitate a return to the initial phase margin of the OTA 216.

Figure 3:
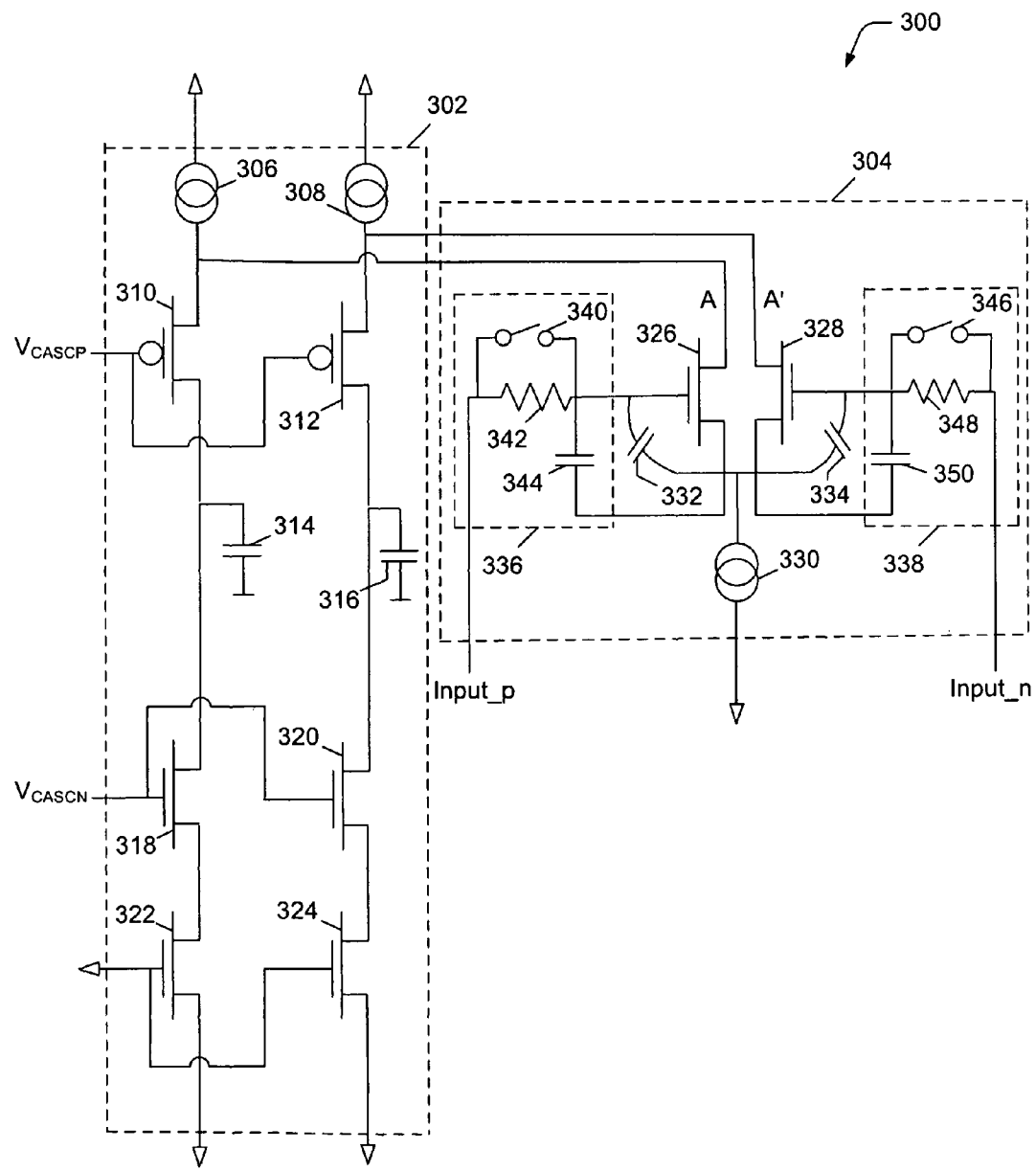
FIG. 3 is a schematic diagram of an operational transconductance amplifier including a first circuit and a second circuit to modify the phase margin of the operational transconductance amplifier.

FIG. 3 is a schematic diagram of an operational transconductance amplifier (OTA) 300 including a first circuit 302 coupled to a second circuit 304, where the second circuit 304 is configured to modify the phase margin of the operational transconductance amplifier 300. The first circuit 302 illustrates an example of a folded cascode arrangement. However, other circuits may serve as a folded cascode arrangement coupled to the second circuit 304. In this disclosure, the first circuit 302 may also be referred to as a folded cascode arrangement and the second circuit 304 may also be referred to as a phase margin modifying circuit or an input circuit.

In some implementations, the first circuit 302 may include a first input current source 306 and a second input current source 308. The first input current source 306 and the second input current source 308 may provide biasing currents to the operational transconductance amplifier 300. In addition, the first input current source 306 may be coupled to the drain of a first positive channel metal oxide semiconductor (PMOS) transistor 310 and the second input current source 308 may be coupled to the drain of a second PMOS transistor 312. The first PMOS transistor 310 and the second PMOS transistor 312 may have a gate voltage of $V_{CASCP}$. The source of the first PMOS transistor 310 may be coupled to a first loading capacitor 314 and the drain of a first negative channel metal oxide semiconductor (NMOS) transistor 318. The source of the second PMOS transistor 312 may be coupled to a second loading capacitor 316 and the drain of a second NMOS transistor 320. The first NMOS transistor 318 and the second NMOS transistor 320 may have a gate voltage of $V_{CASCN}$. The source of the first NMOS transistor 318 may be coupled to the drain of a third NMOS transistor 322 and the source of the second NMOS transistor 320 may be coupled to the drain of a fourth NMOS transistor 324.

The second circuit 304 includes a first input NMOS transistor 326 and a second input NMOS transistor 328. The second circuit 304 also includes a current source 330 coupled to the first input NMOS transistor 326 and the second input NMOS transistor 328. The first input NMOS transistor 326 receives current via the line labeled A in FIG. 3 and the second input NMOS transistor 328 receives current via the line labeled A' in FIG. 3. The first input NMOS transistor 326 includes a first internal gate-source capacitor represented by capacitor 332. The second input NMOS transistor 328 includes a second internal gate-source capacitor represented by capacitor 334. The second circuit 304 also includes a first switch-capacitor arrangement 336 and a second switch-capacitor arrangement 338. The first switch-capacitor arrangement 336 includes a first switch 340 coupled to a first impedance device 342 and a first capacitor 344. The first capacitor 344 may be in parallel with the first internal gate-source capacitor 332 of the first input NMOS transistor 326. Additionally, the second switch-capacitor arrangement 338 includes a second switch 346 coupled to a second impedance device 348 and a second capacitor 340. The second capacitor 340 may be in parallel with the second internal gate-source capacitor 334 of the second input NMOS transistor 328. Further, in an alternative implementation, the first input NMOS transistor 326 and the second input NMOS transistor 328 may be replaced by respective PMOS transistors.

In an illustrative implementation, the second circuit 304 is configured to modify a phase margin of the OTA 300. In some implementations, the second circuit 304 is configured to modify the phase margin of the OTA 300 during a first clock phase. For example, the second circuit 304 may be configured to modify the phase margin of the OTA 300 during a charge transfer phase of a device, such as a switched capacitor filter, including the OTA 300. Additionally, the second circuit 304 may be configured to return the OTA 300 to an initial phase margin during a second clock phase, such as the holding phase of the device including the OTA 300. To illustrate, during the charge transfer phase, the first switch 340 and the second switch 346 may be opened. By opening the first switch 340 and the second switch 346, current is sent through the first impedance device 342 and the second impedance device 348 and an additional non-dominant pole is added to the OTA 300. Consequently, the phase margin of the OTA 300 is reduced and the speed of the OTA 300 increases during the charge transfer phase, such that a device including the OTA 300 settles faster without an increase in power consumption.

When a device including the OTA 300 switches from the charge transfer phase to the holding phase, the first switch 340 and the second switch 346 that were opened during the charge transfer phase are closed. Thus, the additional pole is removed from the OTA 300 and the phase margin of the OTA 300 returns to the initial phase margin. The closing of the first switch 340 and the second switch 346 short circuits the corresponding impedance devices 342 and 348 and eliminates any ringing that may occur when the first switch 340 and the second switch 346 are open. The first impedance device 342 and the second impedance device 348 may each include one or more resistors or any arrangement of other devices, such as one or more capacitors, one or more transistors, one or more inductors, or a combination thereof.

Figure 4:
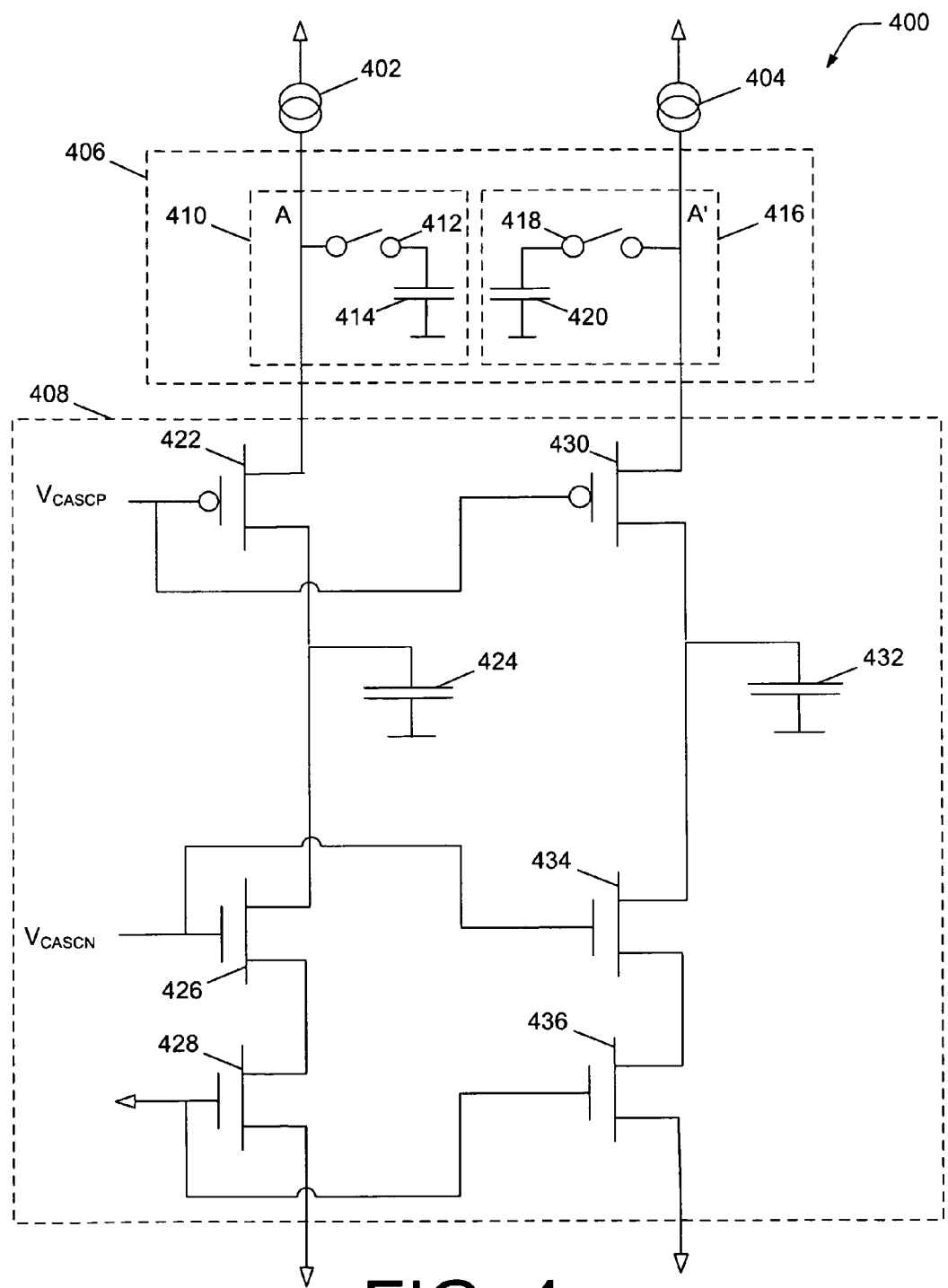
FIG. 4 is a schematic diagram of an operational transconductance amplifier including a first switch-capacitor arrangement and a second switch-capacitor arrangement to modify the phase margin of the operational transconductance amplifier.

In some instances, the addition of a pole near the input of an OTA may increase the noise of the OTA due to impedances associated with the added pole. FIG. 4 is a schematic diagram of an operational transconductance amplifier (OTA) 400 including switch-capacitor arrangements to modify the phase margin of the OTA 400 without the addition of impedance devices near the input of the OTA 400. Thus, the phase margin of the OTA 400 may be modified without increasing the noise associated with the OTA 400.

The OTA 400 includes a first input current source 402 and a second input current source 404. In some implementations, the first input current source 402 and the second input current source 404 may provide biasing currents to the OTA 400. The OTA 400 also includes a phase margin modifying circuit 406 and a folded cascode arrangement 408. The first input current source 402 is coupled to a first switch-capacitor arrangement 410 of the phase margin modifying circuit 406. The first input current source 402 may provide current to the first switch-capacitor arrangement 410 via the line labeled A. The first switch-capacitor arrangement 410 includes a first switch 412 coupled to a first capacitor 414. In addition, the second input current source 404 is coupled to a second switch-capacitor arrangement 416 of the phase margin modifying circuit 406. The second input current source 404 may provide current to the second switch-capacitor arrangement 416 via the line labeled A'. The second switch-capacitor arrangement 416 includes a second switch 418 coupled to a second capacitor 420.

Although a particular circuit is illustrated with respect to the folded cascode arrangement 408, the folded cascode arrangement 408 may include any number of different folded cascode circuits. In some implementations, the folded cascode arrangement 408 may include a first positive channel metal oxide semiconductor (PMOS) transistor 422. A drain of the first PMOS transistor 422 may be coupled to the first input current source 402 and the first switch-capacitor arrangement 410. A gate of the first PMOS transistor 422 may have a voltage $V_{CASCP}$. A source of the first PMOS transistor 422 may be coupled to a first loading capacitor 424 and a drain of a first negative channel metal oxide semiconductor (NMOS) transistor 426. A gate of the first NMOS transistor 426 may have a voltage of $V_{CASCN}$. A source of the first NMOS transistor 426 may be coupled to a drain of a second NMOS transistor 428.

Additionally, the folded cascode arrangement 408 may include a second PMOS transistor 430. A drain of the second PMOS transistor 430 may be coupled to the second input current source 404 and the second switch-capacitor arrangement 416. A gate of the second PMOS transistor 430 may have a voltage $V_{CASCP}$. A source of the second PMOS transistor 430 may be coupled to a second loading capacitor 432 and a drain of a third NMOS transistor 434. A gate of the third NMOS transistor 434 may have a voltage of $V_{CASCN}$. A source of the third NMOS transistor 434 may be coupled to a drain of a fourth NMOS transistor 436.

In an illustrative implementation, the first switch-capacitor arrangement 410 and the second switch-capacitor arrangement 416 are configured to modify a phase margin of the OTA 400 during a particular phase of a device, such as a switched capacitor filter, including the OTA 400. For example, the first switch 412 and the second switch 414 may be closed during a phase of the device, such as the charge transfer phase, and current is sent to the first capacitor 414 and the second capacitor 420. Thus, the phase margin of the OTA 400 is reduced by modifying a non-dominant pole of the OTA 400. Reducing the phase margin using the first switch 412 and the second switch 418 causes the OTA 400 to settle faster during the charge transfer phase without increasing power consumption. When the device including the OTA 400 changes to the holding phase, the first switch 412 and the second switch 418 that were closed during the charge transfer phase are opened. Consequently, the modified non-dominant pole of the OTA 400 returns to an initial state and the phase margin also returns to the initial phase margin.

Figure 5:
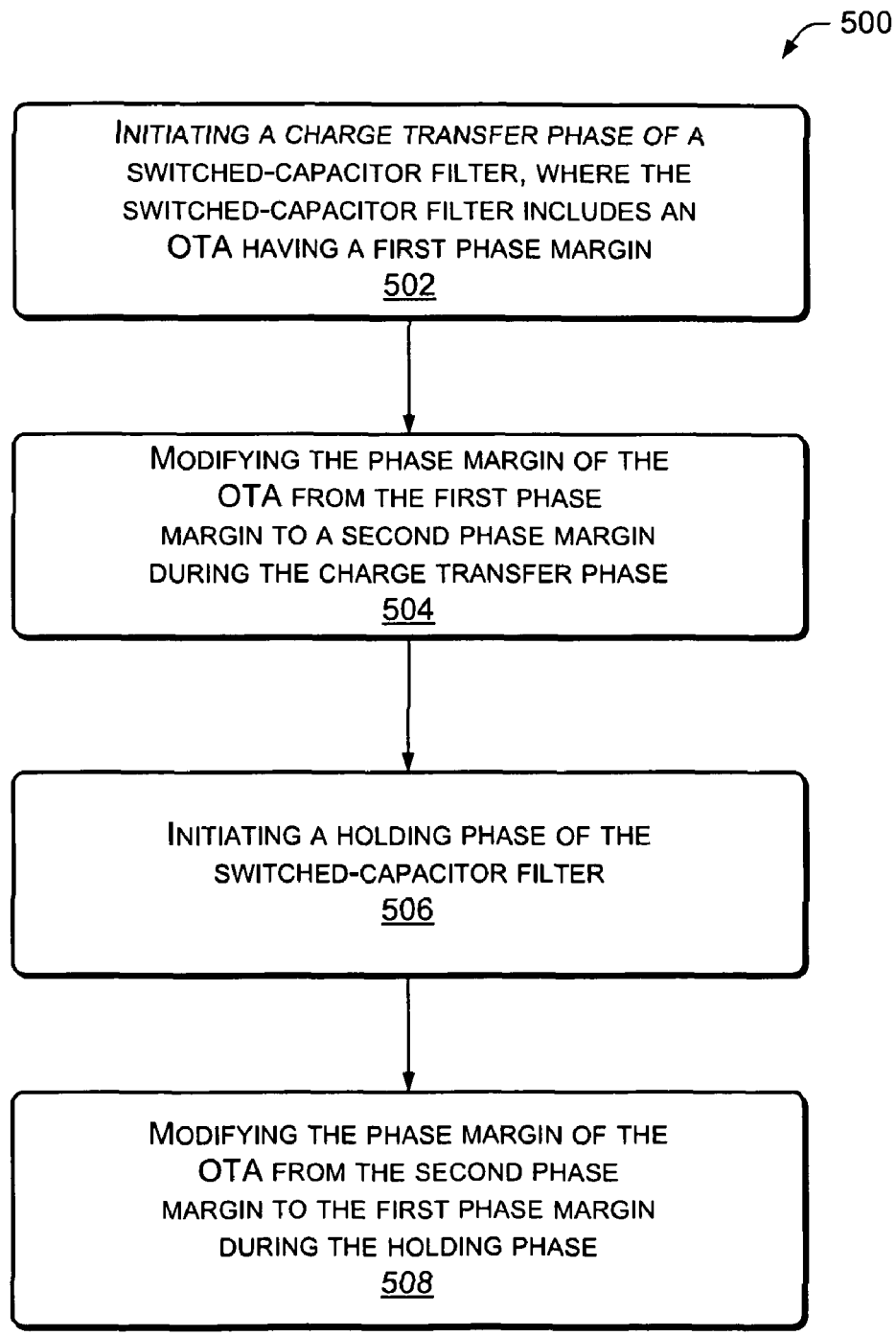
FIG. 5 is a flow diagram of a method of modifying the phase margin of an operational transconductance amplifier included in a switched capacitor filter.

FIG. 5 is a flow diagram of a method 500 of modifying the phase margin of an operational transconductance amplifier (OTA). The OTA may be a folded cascode OTA of a switched capacitor circuit, such as a switched capacitor filter.

Specifics of an exemplary method are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable storage media. The computer-readable storage media can be any available media that can be accessed by a computing device to implement the instructions stored thereon.

The method 500 begins at 502 with initiating a charge transfer phase of a switched capacitor filter including an OTA. The OTA may have an initial, first phase margin at the beginning of the charge transfer phase. The first phase margin may be based on a number of poles of the OTA. At 504, a phase margin of the OTA is modified to a second phase margin during the charge transfer phase. For example, the phase margin of the OTA may decrease from the first phase margin to the second phase margin.

The operation of one or more switches of the phase margin modifying circuit of the OTA may change the number of poles of the OTA. For example, in a particular implementation, the phase margin is modified by adding a non-dominant pole to the OTA by operating one or more switches of a phase margin modifying circuit of the OTA. An example of an OTA including a phase margin modifying circuit configured to add a non-dominant pole to the OTA is shown in FIG. 3. In another particular implementation, the phase margin is changed by modifying an existing non-dominant pole of the OTA. For example, an existing non-dominant pole may be modified by operating one or more switches of a phase margin modifying circuit. An example of an OTA including a phase margin modifying circuit configured to modify an existing non-dominant pole of the OTA is shown in FIG. 4. Modifying the phase margin of the OTA causes the switched capacitor filter to settle faster by increasing the speed of the charge transfer phase, which improves performance, without increasing power consumption.

At 506, a holding phase of the switched capacitor filter is initiated. At 508, the phase margin of the OTA is modified from the second phase margin to the first phase margin during the holding phase of the switched capacitor filter. The OTA may return to having the first phase margin by operating one or more switches of a phase margin modifying circuit of the OTA. For example, as described above with respect to FIG. 3, when a non-dominant pole is added to the OTA by opening one or more switches of the phase margin modifying circuit, the OTA may remove the non-dominant pole that was added and return to having the first phase margin by closing the one or more switches during the holding phase that had been opened during the charge transfer phase. In another example, as described with respect to FIG. 4, when a non-dominant pole of the OTA is modified by closing one or more switches of the phase margin modifying circuit of the OTA, the OTA may return to having the first phase margin by opening the one or more switches during the holding phase that had been closed during the charge transfer phase.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

I claim:

1. An operational transconductance amplifier (OTA) comprising:
    a first circuit having a folded cascode arrangement; and
    a second circuit coupled to the first circuit, wherein operation of one or more switches of the second circuit modifies a first phase margin of the OTA to produce a second phase margin by adding a non-dominant pole to the OTA.

2. The OTA of claim 1, wherein the second circuit modifies the phase margin of the OTA during a charge transfer phase.

3. The OTA of claim 1 wherein the second circuit comprises a first switch-capacitor arrangement including a first switch coupled to a first impedance device and a first capacitor and a second switch-capacitor arrangement including a second switch coupled to a second impedance device and a second capacitor.

4. The OTA of claim 3, wherein the first switch, the second switch, or a combination thereof, are open during a charge transfer phase.

5. The OTA of claim 3, wherein the first switch, the second switch, or a combination thereof, are closed during a holding phase.

6. The OTA of claim 3, further comprising a first negative channel metal oxide semiconductor (NMOS) transistor coupled to the first switch-capacitor arrangement and a second NMOS transistor coupled to the second switch-capacitor arrangement.

7. The OTA of claim 3, further comprising a first positive channel metal oxide semiconductor (PMOS) transistor coupled to the first switch-capacitor arrangement and a second PMOS transistor coupled to the second switch-capacitor arrangement.

8. An operational transconductance amplifier (OTA) comprising:
    a first circuit including a folded cascode arrangement; and
    a second circuit including a phase margin modifying circuit, the phase margin modifying circuit including a first switch-capacitor arrangement coupled to the folded cascode arrangement and a second switch-capacitor arrangement coupled to the folded cascode arrangement, the first switch-capacitor arrangement comprising a first switch and a first capacitor and the second switch-capacitor arrangement comprising a second switch and a second capacitor.

9. The OTA of claim 8, wherein the first switch is coupled to a first input current source and the second switch is coupled to a second input current source.

10. The OTA of claim 9, wherein the first switch, the second switch, or a combination thereof, are closed during a charge transfer phase.

11. The OTA of claim 9, wherein the first switch, the second switch, or a combination thereof, are open during a holding phase.

12. The OTA of claim 9, wherein operating the first switch, the second switch, or a combination thereof, modifies a non-dominant pole of the OTA and changes a phase margin of the OTA.

13. The OTA of claim 9, wherein the OTA is a component of a switched capacitor filter of a delta-sigma modulator.

14. The OTA of claim 13, wherein the delta-sigma modulator is included in a silicon microphone.

15. A method comprising:
    initiating a charge transfer phase of a switched capacitor filter, wherein the switched capacitor filter includes an operational transconductance amplifier (OTA) having a first phase margin;
    modifying the phase margin of the OTA from the first phase margin to a second phase margin during the charge transfer phase;
    initiating a holding phase of the switched capacitor filter; and
    modifying the phase margin of the OTA from the second phase margin to the first phase margin during the holding phase of the switched capacitor filter.

16. The method of claim 15, wherein modifying the phase margin of the OTA increases a rate at which charge is accumulated in an integrating capacitor of the switched capacitor filter during the charge transfer phase.

17. The method of claim 15, wherein returning to the first phase margin comprises operating one or more switches of a phase margin modifying circuit of the OTA.

18. The method of claim 15, wherein the phase margin of the OTA is based on a number of poles of the OTA and operating one or more switches of a phase margin modifying circuit of the OTA changes the number of poles of the OTA.

19. The method of claim 18, wherein the number of poles of the OTA increases and the phase margin of the OTA decreases in order to increase a rate at which charge is transferred to an integrating capacitor of the switched capacitor filter.

20. The method of claim 18, further comprising adding a respective non-dominant pole to the OTA during the charge transfer phase and removing the respective non-dominant pole from the OTA during the holding phase.

* * * * *